United States Patent
Alvandpour et al.

(10) Patent No.: US 6,388,940 B1
(45) Date of Patent: May 14, 2002

(54) LEAKAGE-TOLERANT CIRCUIT AND METHOD FOR LARGE REGISTER FILES

(75) Inventors: Atila Alvandpour, Portland, OR (US); Ganesh Balamurugan, Urbana, IL (US); Krishnamurthy Soumyanath, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/672,177

(22) Filed: Sep. 27, 2000

(51) Int. Cl.[7] .................................. G11C 8/00
(52) U.S. Cl. .............................. 365/230.05; 365/189.11
(58) Field of Search ...................... 365/189.05, 189.11, 365/154, 230.05

(56) References Cited

U.S. PATENT DOCUMENTS

| | | | | |
|---|---|---|---|---|
| 5,477,489 A | * | 12/1995 | Weidmann | 365/230.05 |
| 6,038,193 A | * | 3/2000 | Wang et al. | 365/230.05 |
| 6,320,795 B1 | * | 11/2001 | Balamurugan et al. | 365/230.05 |

* cited by examiner

*Primary Examiner*—Trong Phan
(74) *Attorney, Agent, or Firm*—Blakely, Sokoloff, Taylor & Zafman LLP

(57) ABSTRACT

A novel circuit technique for reducing leakage currents through the read-path of large register files in which a negative gate-source voltage is forced on a critical pass transistor between a cell read transistor and a local bitline such that when the cell is in a first state, the leakage current from a dynamic node of the cell read transistor is reduced. The reduced leakage current increases the robustness and performance of the read operation.

18 Claims, 3 Drawing Sheets

LEAKAGE-TOLERANT CIRCUIT AND METHOD FOR LARGE REGISTER FILES

BACKGROUND OF THE INVENTION

1. Field of the Invention

The present invention relates to large register files and methods for operation of the same.

2. Art Background

Modern processors typically include extensive execution resources to support concurrent processing of multiple instructions. These execution resources receive data from a hierarchy of storage structures with varying access latencies. One or more register files are located on the processor chip to provide data to the execution resources with very low latencies. Other storage structures include on-chip caches, off-chip caches, and a main memory, which provide data to execution resources with correspondingly longer latencies. Because register files are a primary source of data for execution resources, high performance processors typically employ larger register files, which have more off register cells. These larger register files maintain more data near the processor's execution resources, where it can be accessed with relatively low latency by multiple execution units.

However, as the size of the register files increase and lower on-off current ratios are utilized, as are foreseen in deep sub-micron MOSFETs, the detrimental effects of steeply increasing sub-threshold currents on the robustness of large register files must be addressed.

The problem is illustrated by reference to FIG. 1. In this illustration, sixteen register file (RF) cell read ports 15 are connected to a local bitline 20 that is precharged by the signal CLK 25. In a worst-case scenario where the data value stored in the 16 cells is a logic 1, considerable charge leakage occurs through the $M_{read}$ transistors 30. To counteract this, the size-of the keeper transistor $M_{keep}$ 35 must be increased, which degrades performance.

BRIEF DESCRIPTION OF THE DRAWINGS

The features of the present invention will be apparent from the following detailed description which.

DETAILED DESCRIPTION

The following discussion sets forth numerous specific details to provide a thorough understanding of the invention. However, those of ordinary skill in the art, having the benefit of this disclosure, will appreciate that the invention may be practiced without these specific details. In addition, various well-known methods, procedures, components, and circuits have not been described in detail in order to focus attention on the features of the present invention.

Figure 1:
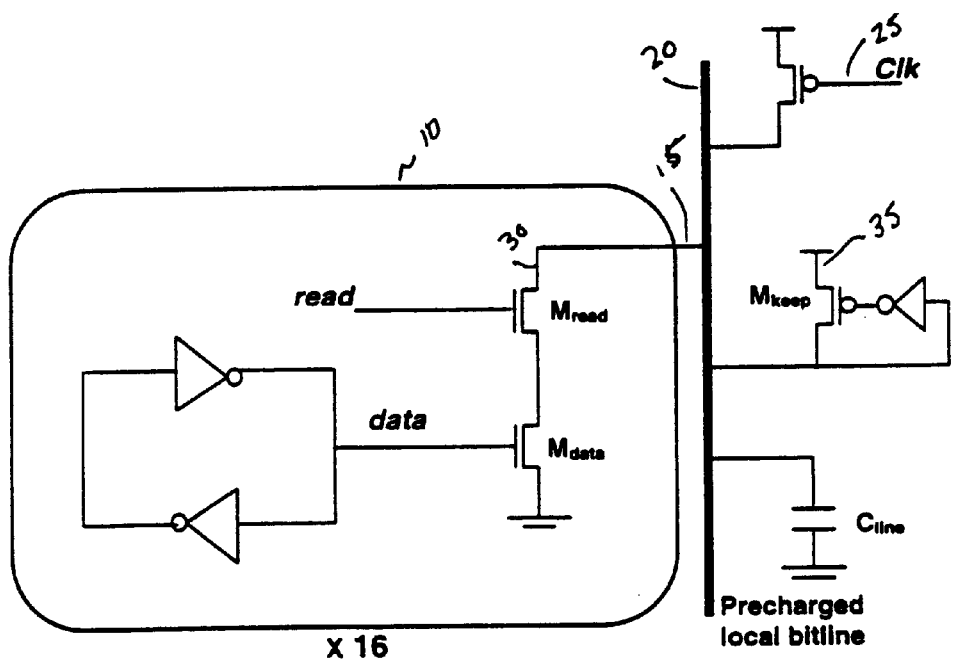
FIG. 1 illustrates a prior art register file cell.
Figure 2:
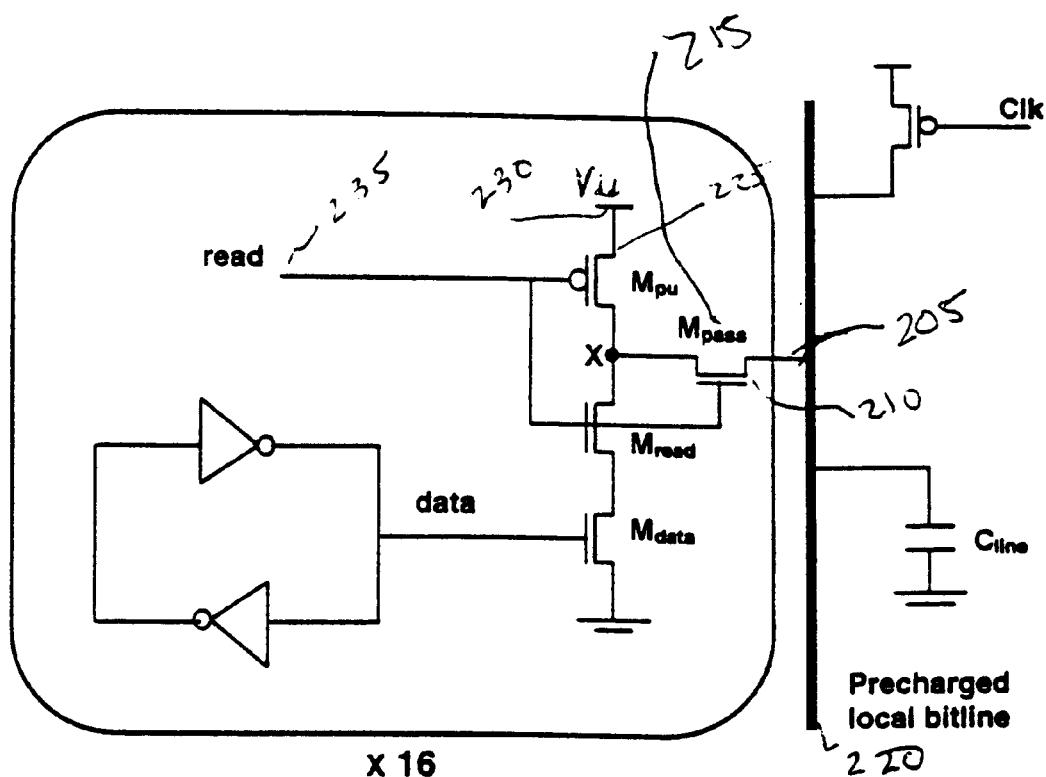
FIG. 2 illustrates one embodiment of the register file cell of the present invention.

One embodiment of the present invention is illustrated by FIG. 2. In this embodiment, the need for a strong keeper device is eliminated while providing increased leakage tolerance. In addition, an increase in robustness is experienced without any degradation of read access time.

To provide these benefits the undesirable leakage of charge due to sub-threshold current from the dynamic node 205 is reduced by forcing a negative gate-source voltage $V_{gs}$ 210 on a critical pass transistor $M_{pass}$ 215 connected to the noise sensitive dynamic bitline 220. The cell also includes a pull up transistor $M_{pu}$ 225 which functions to selectively provide the supply voltage $V_{dd}$ 230 based upon the state of the read signal 235. The circuit is configured to operate in response to particular "states" of the cell; it is apparent to one skilled in the art that the present invention describes the states in terms of one embodiment of particular signal levels. Other implementations are also contemplated.

Figure 3:
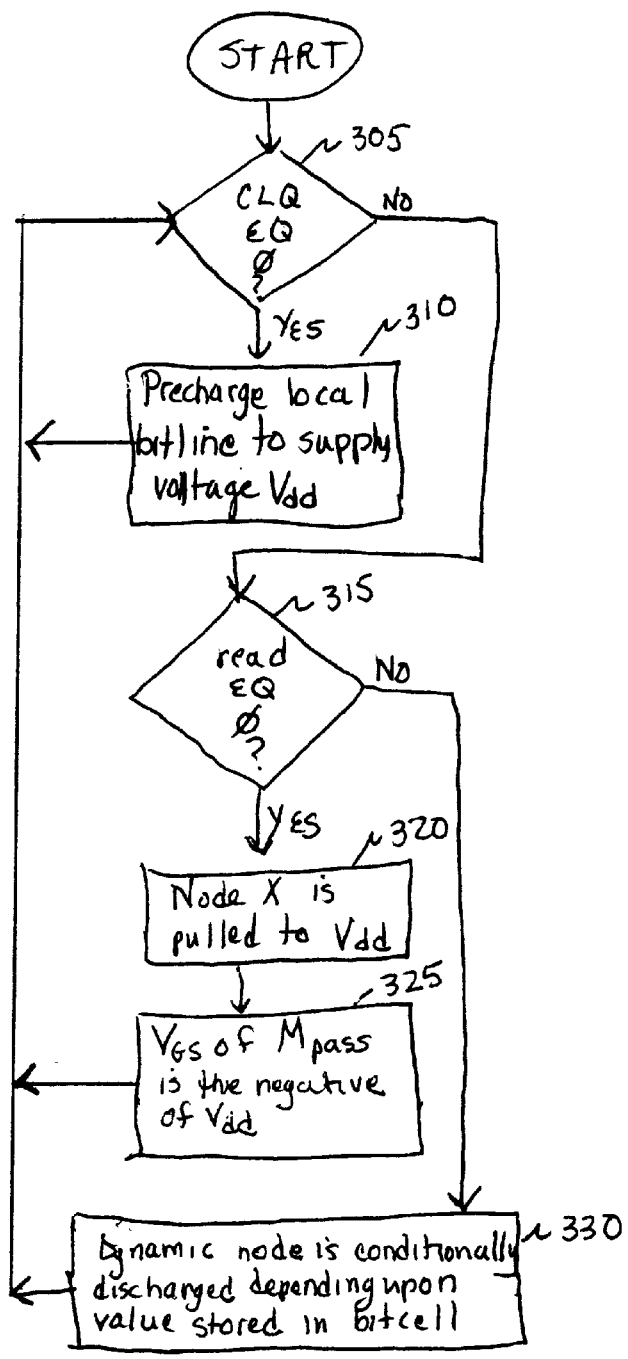
FIG. 3 is a simplified flow diagram of one embodiment of the process of the present invention.

One embodiment of the process of the present invention is illustrated by the flow diagram of FIG. 3. At step 305, if the clock signal CLK is in a second state, for example, if CLK is asserted low, the local bit line is precharged to the supply voltage $V_{dd}$, step 310. If CLK is high, and the read signal is asserted low, step 315, such that the circuit is in a first state, node X is pulled to the supply voltage Vdd, step 320 and the gate-source voltage of $M_{pass}$ is the negative of Vdd, step 325. Tis reduces the leakage current to a negligible value thus helping to retain the charge on the dynamic node. When read is high, the dynamic node is conditionally discharged depending on the value stored in the bitcell, step 330.

Thus, reliable operation of RF cells and therefore register files, is achieved, even when sub-threshold leakage is significant. The increased leakage tolerance also allows more RF cells to share a local bitline, leading to a potential decrease in read-access time.

The invention has been described in conjunction with a preferred embodiment. It is evident that numerous alternatives, modifications, variations and uses will be apparent to those skilled in the art in light of the foregoing description.

What is claimed is:

1. A method for reducing leakage current in a register file cell comprising forcing a negative gate-source voltage on a critical pass transistor between a cell read transistor and a local bitline such that when the cell is in a first state, the leakage current from a dynamic node of the cell read transistor is reduced.

2. The method as set forth in claim 1, further comprising precharging the local bitline to a supply voltage when the cell is in a second state.

3. The method as set forth in claim 1 wherein forcing further comprises pulling the drain of the critical pass transistor to the supply voltage.

4. The method as set forth in claim 1, further comprising conditionally discharging a node depending on the value stored in the cell.

5. The method of claim 1, wherein when the cell is in a third state, conditionally discharging the dynamic node depending upon the value stored in the cell.

6. A low leakage register file cell comprising:

a cell read transistor;

a critical pass transistor coupled between the cell read transistor and a local bitline such that when the cell is in a first state, the leakage current from the cell read transistor is reduced.

7. The low leakage register file cell of claim 6, wherein when the cell is in the first state, a line coupled to a drain of the critical pass transistor is pulled to a supply voltage.

8. The low leakage register file cell of claim 6, wherein when the cell is in a second state, the local bit line is precharged to a supply voltage.

9. The low leakage register file cell of claim 6, wherein when the cell is in a third state, the dynamic node is conditionally discharged depending upon the value stored in the cell.

10. The low leakage register file cell of claim 6, further comprising a pull up transistor coupled between a supply voltage and a nodes of the critical pass transistor and cell read transistor such that when the cell is in the first state the nodes are pulled to the supply voltage.

11. A low leakage register file system comprising:
   a local bitline;
   a first input coupled to the bitline, the first input issuing control signals o control the file system;
   a plurality of cells coupled to the bitline, each cell comprising;
   a cell read transistor;
   a critical pass transistor coupled between the cell read transistor and the local bitline such that when the cell is in a first state, the leakage current from the cell read transistor is reduced.

12. The low leakage register file cell of claim 11, wherein when a cell of the plurality of cells is in the first state, a line coupled to a drain of the critical pass transistor is pulled to a supply voltage.

13. The low leakage register file cell of claim 11, wherein when a cell of the plurality of cells is in a second state, the local bit line is precharged to a supply voltage.

14. The low leakage register file cell of claim 11, wherein when a cell of the plurality of cells is in a third state, the dynamic node is conditionally discharged depending upon the value stored in the cell.

15. The low leakage register file cell of claim 11, each cell further comprising a pull up transistor coupled between a supply voltage and a nodes of the critical pass transistor and cell read transistor such that when a cell of the plurality of cells is in the first state the nodes are pulled to the supply voltage.

16. An apparatus for reducing leakage current in a register file cell comprising:
   a critical pass transistor means coupled between a cell read transistor and a local bitline; and
   means for forcing a negative gate-source voltage on the critical pass transistor means such that when the cell is in a first state, the leakage current from a dynamic node of the cell read transistor is reduced.

17. The apparatus as set forth in claim 16, further comprising means for precharging the local bitline to a supply voltage when the cell is in a second state.

18. The apparatus as set forth in claim 16, wherein the means for forcing further comprises means for pulling the drain of the critical pass transistor to the supply voltage.

* * * * *

UNITED STATES PATENT AND TRADEMARK OFFICE
CERTIFICATE OF CORRECTION

PATENT NO. : 6,388,940 B1
DATED : May 14, 2002
INVENTOR(S) : Alvandpour et al.

It is certified that error appears in the above-identified patent and that said Letters Patent is hereby corrected as shown below:

Column 1,
Line 21, after "more", delete "off".
Line 42, before "which", insert -- in --.

Signed and Sealed this

Twelfth Day of November, 2002

Attest:

JAMES E. ROGAN
Attesting Officer　　　Director of the United States Patent and Trademark Office